(12) United States Patent
Karoui et al.

(10) Patent No.: US 7,710,204 B2
(45) Date of Patent: May 4, 2010

(54) ADAPTIVE PROTECTION CIRCUIT FOR A POWER AMPLIFIER

(75) Inventors: Walid Karoui, Toulouse (FR); Giles Montoriol, Tournefeuille (FR); Philippe Riondet, Ramonville St. Agne (FR)

(73) Assignee: Freescale Semiconductor, Inc., Austin, TX (US)

( * ) Notice: Subject to any disclaimer, the term of this patent is extended or adjusted under 35 U.S.C. 154(b) by 67 days.

(21) Appl. No.: 11/911,930

(22) PCT Filed: Apr. 18, 2005

(86) PCT No.: PCT/EP2005/005210

§ 371 (c)(1),
(2), (4) Date: Oct. 18, 2007

(87) PCT Pub. No.: WO2006/111186

PCT Pub. Date: Oct. 26, 2006

(65) Prior Publication Data
US 2008/0211585 A1    Sep. 4, 2008

(51) Int. Cl.
    H03F 1/52    (2006.01)
(52) U.S. Cl. .................................. 330/298; 330/207 P
(58) Field of Classification Search .............. 330/207 P, 330/298; 455/117
    See application file for complete search history.

(56) References Cited

U.S. PATENT DOCUMENTS

| | | | |
|---|---|---|---|
| 5,081,425 A | 1/1992 | Jackson et al. | |
| 5,473,498 A | 12/1995 | Krett | |
| 6,198,351 B1 * | 3/2001 | Winslow | 330/298 |
| 6,278,328 B1 | 8/2001 | Yamamoto et al. | |
| 6,392,258 B1 | 5/2002 | Hirata et al. | |
| 6,525,611 B1 | 2/2003 | Dening et al. | |
| 6,580,321 B1 | 6/2003 | Arell et al. | |
| 6,621,351 B2 | 9/2003 | Hill | |
| 6,850,119 B2 | 2/2005 | Arnott | |
| 7,262,667 B2 | 8/2007 | Gilsdorf et al. | |
| 2004/0082354 A1 | 4/2004 | Cohen | |
| 2004/0099879 A1 | 5/2004 | Chen et al. | |

FOREIGN PATENT DOCUMENTS

| | | |
|---|---|---|
| EP | 1387485 A1 | 2/2004 |
| EP | 1601104 A1 | 11/2005 |

OTHER PUBLICATIONS

A high performance RF power amplifier with protection against load mismatches Scuderi, A.; Carrara, F.; Castorina, A.; Palmisano, G.; Microwave Symposium Digest, 2003 IEEE MTT-S International vol. 2, Jun. 8-13, 2003 pp. 699-702 vol. 2.

(Continued)

*Primary Examiner*—Khanh V Nguyen

(57) ABSTRACT

A radio frequency device comprises a radio frequency (RF) power amplifier (PA) operably coupled to a protection circuit for minimising voltage standing wave ratio effects, wherein the protection circuit comprises a current limiter indexed to a power supplied to the RF PA.

In this manner, the protection circuit combines detection of both current and voltage increase in order to provide a direct feedback on the final RF PA stage via a bias control.

15 Claims, 3 Drawing Sheets

OTHER PUBLICATIONS

A highly integrated quad-band GSM TX-front-end-module DiCarlo, P.; Boerman, S.; Burton, R.; Chung, H.-C.; Evans, D.; Gerard, M.; Gering, J.; Khayo, I.; Lagrandier, L.; Lalicevic, I.; Reginella, P.; Sprinkle, S.; Tkachenko, Y.; Gallium Arsenide Integrated Circuit (GaAs IC) Symposium, 2003. 25th Annual Technical Digest 2003. IEEE 2003 pp. 280-283.

Pusl et al. "SiGe Power Amplifier ICs With SWR Protection For Handset Applications", Microwave Journal, pp. 100-113. Jun. 2001.

Gering, J. M., "A Quad-Band Ingap HBT Power Amplifier Module With 60% EGSM Power Added Efficiency and 35:1 Open Loop Ruggedness", Power Amplifier Workshop, Sep. 8, 2003.

* cited by examiner

ADAPTIVE PROTECTION CIRCUIT FOR A POWER AMPLIFIER

FIELD OF THE INVENTION

The preferred embodiment of the present invention relates to a power amplifier (PA) module. The invention is applicable to, but not limited to, an adaptive protection circuit for a wireless communication unit's radio frequency power amplifier arranged to prevent high current effects due to a voltage standing wave ratio (VSWR).

BACKGROUND OF THE INVENTION

In the field of radio frequency (RF) power amplifiers (PAs), a PA is typically designed to be 'matched' into a 50 ohm load impedance, to ensure efficient power transfer from an RF input signal to an amplified RF output signal. This enables a low power RF input signal to be amplified and a maximum amount of the amplified signal forwarded on to, say, an antenna switch and/or an antenna. In this manner, maximum power transfer is achieved and minimal power is reflected back into the PA output. The reflection back of power is typically due to "load mismatch", for example where the antenna switch or antenna load does not exhibit a 50 Ohm load. This can be due to the antenna being located near an object that affects its radiation properties, and correspondingly its impedance values.

It has been found that load mismatch problems occur, in particular, under both high power conditions and when a high battery voltage is applied to the power amplifier. In this regard, it can be observed that the DC current increases more than when operating under normal (50-Ohm load) conditions. The increase of DC current, under load mismatch conditions, is highly undesirable (particularly in a hand-portable environment) as it causes increased power consumption and may over-load the power amplifier transistor device thereby resulting in damage to, or failure of, the device.

Known mechanisms do not solve the aforementioned problems. For example, voltage limiters do not protect the PA from mismatch conditions that lead to high current. Furthermore, existing current limiters do not protect efficiently the PA from battery voltage variations under mismatch. Known solutions use circuitry external to the power amplifier module to realize the function, when the PA is located on Gallium Arsenide (GaAs). Undesirably, this results in extra inputs/outputs (I/O) leads on the PA die. Alternatively, if a monolithically integrated circuit (IC) is used, for example where the PA is manufactured on Silicon Germanium (SiGe), approximately 20% of additional die size is required.

To accommodate mismatch problems, protection circuits are often used. A standard current limiter protection circuit is illustrated in FIG. 1. In FIG. 1, the radio frequency input signal ($RF_{in}$) 105 is input to a base port of power transistor 110. The power transistor 110 is supplied from a battery voltage 115 via an RF choke inductor 120 to provide a RF amplified output voltage 125.

The emitter port of the RF power transistor 110 includes a sensing resistor 130 to ground. The emitter port of the RF power transistor 110 is also operably coupled to a protection circuit 140. The protection circuit 140 comprises a multiplier circuit 145, receiving the detected voltage developed across the sensing resistor 130 and a comparator circuit 150, comparing the output from the multiplier circuit 145 with a reference voltage 155, which sets the chosen limiting current. The comparator circuit 150 output is input to a transistor (Q1), which effectively is switching the bias circuit 135 to 'ground' when the voltage coming from the multiplier 145 is greater than the reference voltage 155, thereby reducing the bias current of the power transistor 110.

Thus, as shown, the use of a protection circuit adds significantly to the size and complexity of power amplifier circuits, with regard to the extra circuitry/components (typically two operational amplifiers) that are required to generate/compare the detected voltage to the reference voltage 155, which is set by additional external circuitry.

However, the effectiveness of the protection circuit is compromised due to the operational amplifier offset voltage $\epsilon 1$ (comparable to the detected voltage $V_{det}$) and to the variation of $V_{det}$ with regard to sensing resistor 130 dispersion. It is noteworthy that a low value resistor is more sensitive to process variation than a high value resistor. In addition, the collector efficiency of the power transistor 110 is degraded by the sensing resistor 130. Furthermore, the complexity of the protection circuit may typically lead to undesirable loop stability issues, due to high loop gain.

Thus, a need exists for an improved RF device, such as a wireless communication unit, RF PA module and method of operation therefor, which prevents high current under extreme VSWR conditions, wherein the aforementioned problems with prior art arrangements are substantially alleviated.

STATEMENT OF INVENTION

In accordance with aspects of the present invention, there is provided a radio frequency device, a PA module and method of operation that prevents high current under VSWR and high battery voltage, as defined in the appended Claims.

Figure 2:
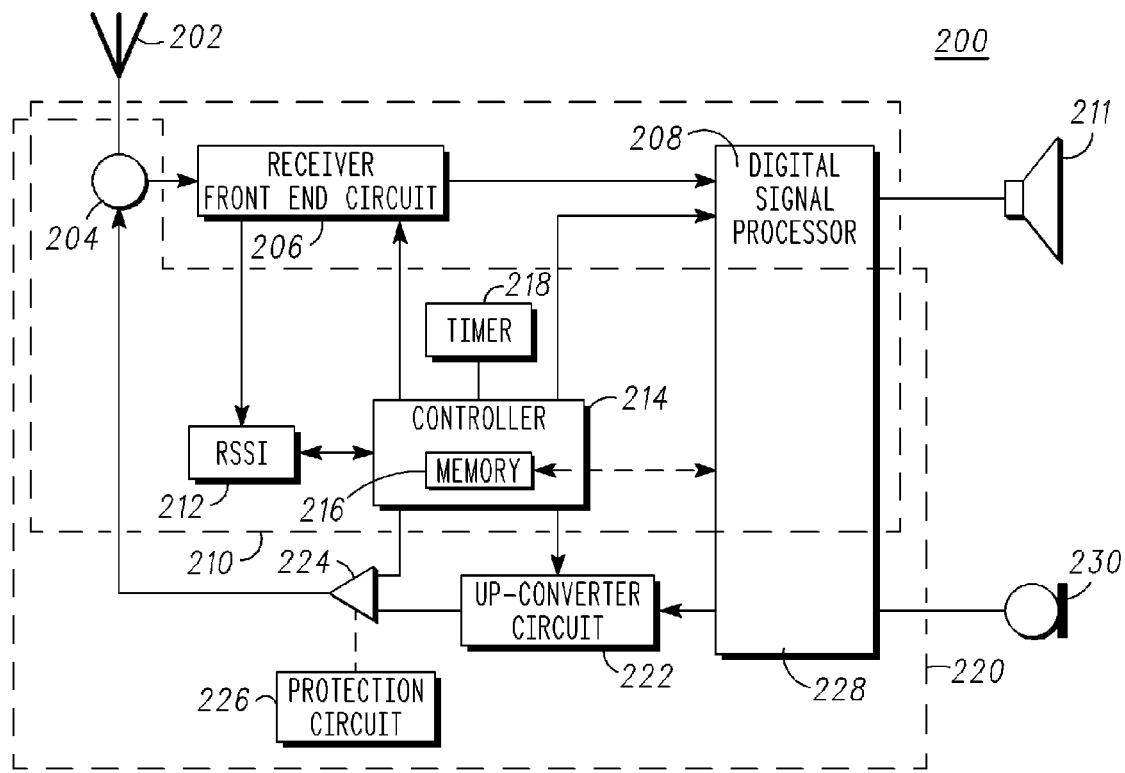
Figure 3:
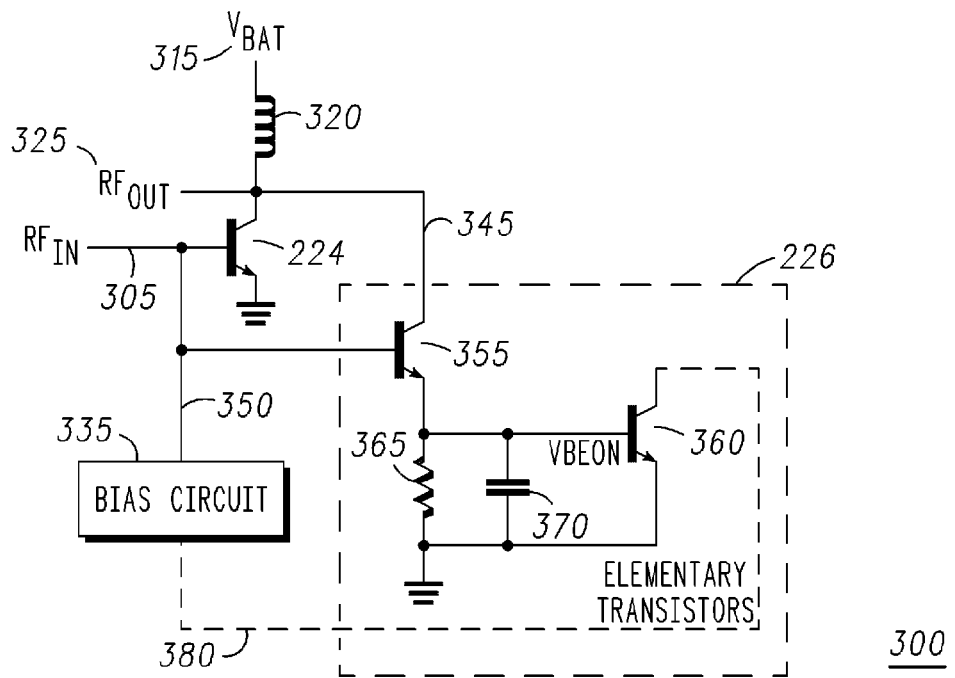
Figure 4:
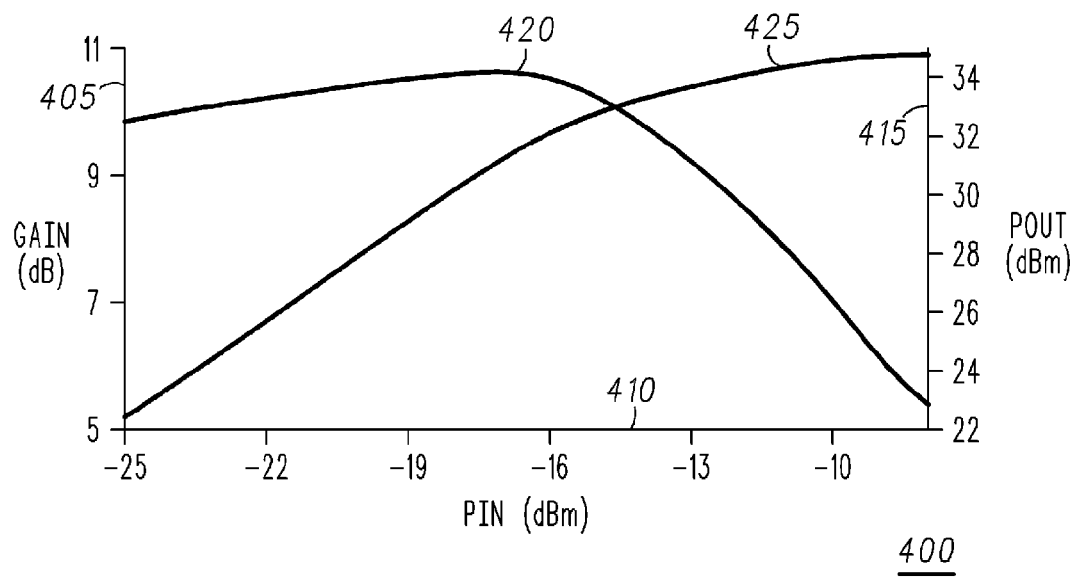
Figure 5:
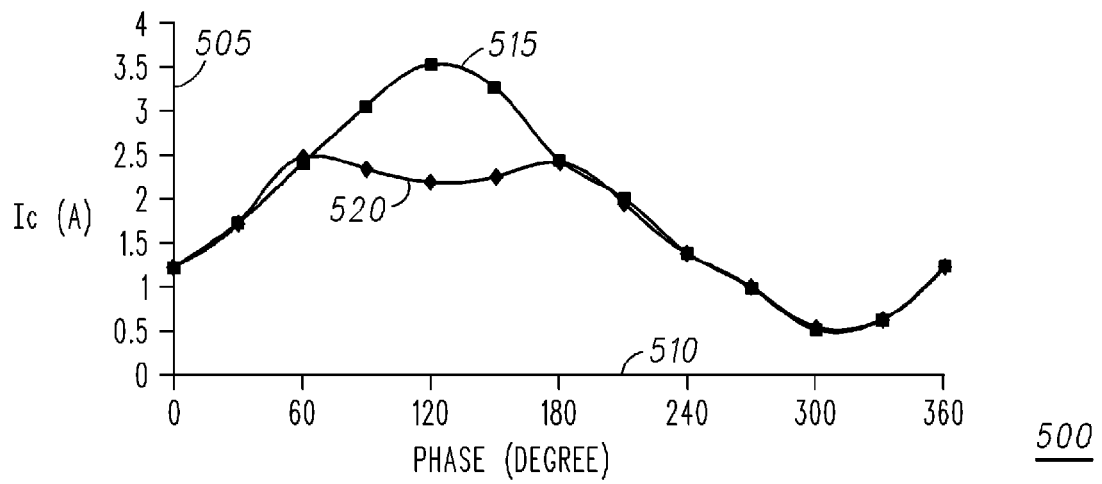
Figure 6:
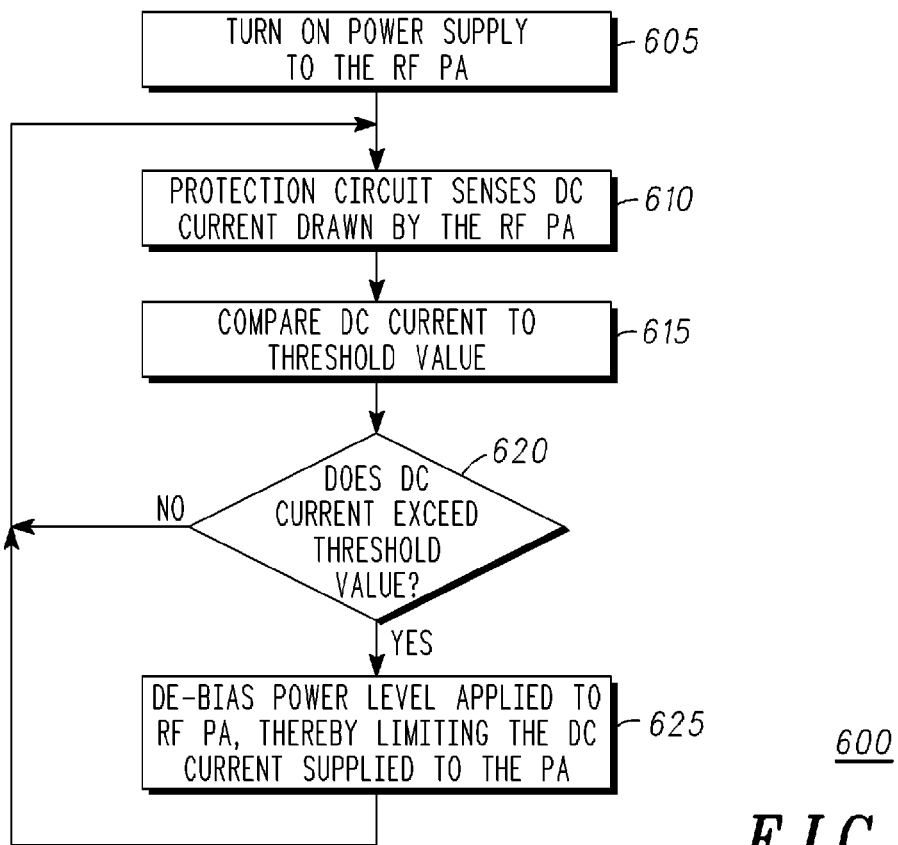

Exemplary embodiments of the present invention will now be described, by way of example only, with reference to the accompanying drawings, in which:

FIG. 2 illustrates a wireless communication unit adapted in accordance with the preferred embodiment of the present invention;

FIG. 3 illustrates a current limiter implementation of a protection circuit, adapted in accordance with the preferred embodiment of the present invention;

FIG. 4 illustrates a graphical comparison of a PA performance with and without the protection circuit according to the preferred embodiment of the present invention;

FIG. 5 illustrates graphically a collector current versus phase at a voltage standing wave ratio (VSWR)=10:1, illustrating the advantages provided by the preferred embodiment of the present invention; and FIG. 6 illustrates a flowchart of the current limiting process applied by the protection circuit to a RF PA in accordance with the preferred embodiment of the present invention.

DESCRIPTION OF PREFERRED EMBODIMENTS

The preferred embodiment of the present invention will be described with respect to an implementation of a radio frequency (RF) power amplifier (PA) module in a wireless communication unit, such as a mobile phone. However, it will be appreciated by a skilled artisan that the inventive concept herein described may be embodied in any type of RF amplifier unit. In summary, the inventive concept of the present invention proposes a monolithically integrated PA module having a cost and size efficient current limiter, notably indexed to battery voltage, for improving a Power Amplifier's (PA) ruggedness, for example, under extreme VSWR conditions over battery voltage range.

In a mobile context, in the known prior art, the current threshold or current limit is fixed, as a reference voltage is used for the battery. However, the battery voltage varies. Thus, and as addressed by the inventive concept hereinafter described, it is important to have a current threshold or current limit that varies as the battery voltage drops. In the present specification, this relationship is termed 'indexing', for example the current threshold varies with regard to battery voltage.

Referring now to FIG. 2, a block diagram of a wireless communication unit 200, capable of supporting the inventive concept of the preferred embodiment of the present invention, is illustrated. For the sake of clarity, the wireless communication unit 200 is shown as divided into two distinct portions—a receiver chain 210 (which will be described briefly for completeness) and a transmit chain 220.

The wireless communication unit 200 contains an antenna preferably coupled to an antenna switch 204 that provides signal control of radio frequency (RF) signals in the wireless communication unit 200, as well as isolation, between the receiver chain 210 and transmit chain 220. Clearly, the antenna switch 204 could be replaced with a duplex filter, for frequency duplex communication units, as known to those skilled in the art.

For completeness, the receiver chain 210 of the wireless communication unit 200 will be briefly described. The receiver chain 210 includes a receiver front-end circuit 206 (effectively providing reception, filtering and intermediate or base-band frequency conversion). The receiver front-end circuit 206 is serially coupled to a signal processing function (generally realised by at least one digital signal processor (DSP)) 208. A controller 214 is operably coupled to the front-end circuit 206 so that the receiver is able to calculate receive bit-error-rate (BER) or frame-error-rate (FER) or similar link-quality measurement data from recovered information via a received signal strength indication (RSSI) 212 function. The RSSI 212 function is operably coupled to the receiver front-end circuit 206. The memory device 216 preferably stores a wide array of data, such as decoding/encoding functions and the like, as well as amplitude and phase settings to ensure a linear and stable output. A timer 218 is operably coupled to the controller 214 to control the timing of operations, namely the transmission or reception of time-dependent signals.

As regards the transmit chain 220, this essentially includes a signal processor 228, operably coupled to a modulation and up-converter circuit 222 and power amplifier module 224. The processor 228 and modulation and up-converter circuit 222 are operationally responsive to the controller 214. The power amplifier module 224 is operably coupled to a protection circuit 226, adapted in accordance with the preferred embodiment of the present invention.

The power amplifier module and protection circuit, adapted in accordance with the preferred embodiment of the present invention, is further illustrated in FIG. 3. Referring now to FIG. 3, a radio frequency input signal ($RF_{in}$) 305 is input to a base port of power amplifier transistor 224. The power amplifier transistor 224 is supplied by a battery voltage 315 via a RF choke inductor 320 to provide a RF amplified output voltage 325. Notably, the emitter port of the RF power transistor 224 is grounded.

In particular, the output 325 of the RF power transistor 224 is operably coupled to a protection circuit 345. The protection circuit 226 is integrated onto the PA die and comprises a first transistor 355, whose collector port is operably coupled to the output 325 and whose base port 350 is operably coupled to the base port of the RF power transistor 224. The emitter port of the first transistor 355 of the protection circuit 226 is operably coupled to a parallel resistor 365-capacitor 370 (R-C) circuit coupled to ground and a base port of a second transistor 360. The collector 380 of the second transistor 360 is coupled to the bias circuit 335, which is operably coupled to the base port of the RF power transistor 224.

Under extreme VSWR conditions, and high battery voltage, the collector current of the power transistor 224 increases more than would be expected under a 50-ohm load. The current flowing through the elementary transistor 355 increases proportionally to the current in the power transistor 224. The detected voltage developed across the sensing resistor 365 also increases with the above-mentioned current. The function of the parallel capacitor 370 is arranged to low pass filter the detected voltage $V_{det}$. Then, this detected DC voltage is input to the base of the second elementary transistor 360. When the detected DC voltage $V_{det}$ exceeds the turn-on voltage $V_{beon}$ of the second elementary transistor 360, it switches the bias circuit 335 to ground, hence reducing the bias current of the power transistor 224.

In the most common case of a multi-stage power amplifier, when the battery voltage increases, the RF input signal $RF_{in}$ 305 on the base of the power transistor 224 (as well as on the base of the first elementary transistor 355) increases leading to a higher current flowing through the sensing resistor 365. This consequently leads to a higher detected voltage $V_{det}$. The turn-on voltage of the second elementary transistor 360 is then reached for a lower collector current in the first elementary transistor 355, and therefore for a lower collector current in the power transistor 224.

In this manner, the inventive concept proposes a monolithically integrated current limiter protection circuit 226, which is indexed to the battery voltage 315, for improving the PA's ruggedness. The power amplifier DC current, dependent upon the battery voltage 315, is thus sensed, transformed into voltage $V_{det}$ across a high value sensing resistor 365 and compared to a threshold voltage value (set by the turn-on voltage of the secondary transistor 360). In this manner, the threshold voltage value is compared to the detected voltage coupled to the sensed power amplifier DC current. When the detected voltage exceeds this threshold value, the DC current is prevented from increasing to an undesirable level by de-biasing the power amplifier.

Thus, the sensed current is indexed to battery voltage 315 for the protection circuit 226. Furthermore, and preferably, the protection circuit 226 uses the same type of device as the RF transistor 224 to be protected. Advantageously, this makes it very easy to integrate into a monolithic IC, thereby removing extra input/output pins between dies.

Moreover, the protection circuit 226 advantageously comprises a low component count, thereby facilitating a reduced size for the protected PA system.

On one hand, the improved protection circuit 226 does not degrade the RF PA performance on a 50-Ohm load, as illustrated in FIG. 4. Under such conditions, the protection circuit 226 is 'OFF' and its current consumption is negligible when compared to the power amplifier 224 collector current. On the other hand, the low current in the first elementary transistor 355 allows use of a high value resistor 365, which is advantageously less sensitive to process variation.

Elementary transistor (incorporates sensing resistor) is a small version of the power transistor.

Figure 1:
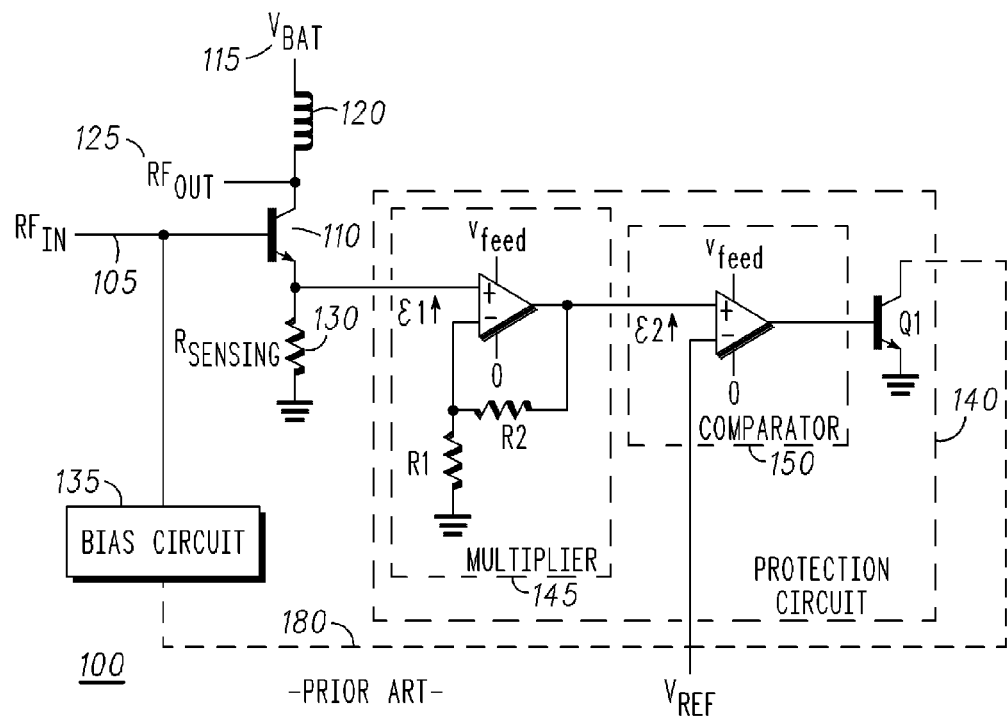
FIG. 1 illustrates a known current limiter implementation using a standard protection circuit design.

This solves the prior art problem of a high current flowing through the power amplifier 110 in FIG. 1, where only a low value sensing resistor 130 can be used in order to minimize PA performance degradation.

Referring now to FIG. 4, a graphical comparison 400 of a PA performance with and without the improved protection circuit 226 is illustrated. As shown, for the same input RF power level ($RF_{in}$) 410, the same gain 405, 420 and same RF power output level 415, 425 can be achieved by the RF power amplifier transistor 224 employing the inventive concept hereinbefore described as well as an RF power amplifier transistor 224 that is not configured to employ the inventive concept.

Referring now to FIG. 5, a collector current 505 versus phase 510 at a voltage standing wave ratio (VSWR) of 10:1 is illustrated graphically 500. The graph 500 highlights the current limiting associated with employing the preferred embodiment of the present invention. The graph 500 illustrates a collector current 515 having a peak collector current of approximately 3.5 A at a phase of 120 degrees when the circuit is not configured with the aforementioned improved protection circuit 226.

When employing the improved protection circuit 226 of the inventive concept hereinbefore described, the collector current of the power transistor 226 does not exceed 2.5 A. This limit is selected by setting the appropriate value of sensing resistor 365.

Referring now to FIG. 6, a flowchart 600 illustrates an overview of the current limiting protection process according to the preferred embodiment of the present invention. The RF input power is applied to the RF PA and as the RF PA is turned on in step 605, the DC current drawn by the RF PA is sensed in step 610. The sensed DC current is transformed into a sensed DC voltage and then compared with a threshold value by the protection circuit in step 615. Thus, the threshold voltage value is compared to the detected voltage coupled to the sensed power amplifier DC current. If the sensed DC voltage does not exceed the threshold value in step 620, limitation on the collector current does not occur.

However, if the sensed DC voltage exceeds the threshold value, in step 620, the protection circuit limits the current being drawn by the RF PA by de-biasing the PA, as shown in step 625. The sensing process then continues in step 610, to determine whether further current limiting needs to be performed by further de-biasing of the PA.

A skilled artisan will appreciate that in other applications, alternative functions/circuits/devices and/or other techniques may be used. Although the preferred embodiment of the present invention has been described with respect to a mobile communication application addressing high current effects due to VSWR effects, it is envisaged that the inventive concept is equally applicable to any application that detects output power and uses the sensed current information for any other purpose, such as linearisation techniques. Furthermore, it is envisaged that other R-C topographies may be used, that incorporate a sensing resistor.

It is within the contemplation of the present invention that the inventive concept can be applied to any product that uses RF power amplifiers, regardless of the frequency or associated technology of the product. It is also envisaged that the inventive concept is equally applicable to use with any RF power transistor, irrespective of the technology, such as bipolar transistors or heterojunction bipolar transistors (HBTs).

It will be understood that the improved RF device, for example a wireless communication unit such as a mobile phone, a RF PA module and method of operation therefore, which prevents high current being drawn by the RF PA under extreme VSWR conditions, as described above, aims to provide at least one or more of the following advantages:

(i) There is no need to detect the VSWR effects on the RF power amplifier transistor.

(ii) The inventive concept combines detection of both current and supply voltage increase. Since mainly high collector current leads to power transistor permanent failure, the inventive concept limits the collector current and therefore maintains this current into non destructive operating values (iii) The inventive concept provides a direct feedback on the final RF power amplifier stage itself, via the DC bias circuit.

(iv) The inventive concept is very easy to implement, in that the improved protection circuit has a low component count. For example, the improved protection circuit requires only two transistors and does not require use of any operational amplifier. This facilitates a smaller die size.

(v) The inventive concept is supply (battery) voltage dependent.

(vi) The inventive concept provides low sensitivity to process variations, due to the use of a high value resistor in the protection circuit.

(vii) The inventive concept can be tuned for any collector current limit value.

(viii) The inventive concept can be integrated on GaAs with no additional I/O pins required.

In particular, it is envisaged that the aforementioned inventive concept can be applied by a semiconductor manufacturer to any power amplifier module having a protection circuit. It is further envisaged that, for example, a semiconductor manufacturer may employ the inventive concept in a design of a stand-alone device, such as a RF power amplifier module, or application-specific integrated circuit (ASIC) and/or any other sub-system element.

Whilst the specific and preferred implementations of the embodiments of the present invention are described above, it is clear that one skilled in the art could readily apply variations and modifications of such inventive concepts.

Thus, an improved RF device such as a wireless communication unit, RF PA module and method of operation therefor have been described, particularly to prevent a high current being drawn by the RF PA under extreme VSWR conditions, wherein the aforementioned disadvantages with prior art arrangements have been substantially alleviated.

The invention claimed is:

1. A radio frequency device comprises:
a radio frequency (RF) power amplifier (PA) operably coupled to a protection circuit for minimising voltage standing wave ratio effects, wherein the protection circuit is operably coupled between an input port and a collector port of the RF PA and comprises a current sense function for sensing a power amplifier DC current and a current limiter indexed to a power supplied to the RF PA for limiting the power amplifier DC current in response to the sensed current.

2. A radio frequency device according to claim 1, wherein the current limiter is a monolithically integrated current limiter.

3. A radio frequency device according to claim 1, wherein the radio frequency device is a wireless communication unit and power supplied to the RF PA is from a battery.

4. A radio frequency device according to claim 1, further comprising a comparator function operably coupled to the current sense function and arranged to compare a threshold voltage value to a detected voltage associated with the sensed power amplifier DC current.

5. A radio frequency device according to claim 4 further comprising a power amplifier bias circuit operably coupled to the protection circuit such that when the detected voltage exceeds the threshold voltage value, the protection circuit prevents the power amplifier DC current from increasing by de-biasing power supplied to the RF power amplifier via the bias circuit.

6. A radio frequency device according to claim 1, wherein the protection circuitry and the RF PA use substantially a similar type of active device.

7. A radio frequency device according to claim 5, wherein the sensed power amplifier DC current relates to a voltage supplied to the RF PA such that the protection circuit senses both a current and a supply voltage increase and in response to the sensing controls a bias level applied to the RF PA.

8. A radio frequency device according to claim 7, wherein the radio frequency device is a radio frequency (RF) power amplifier (PA) module.

9. A radio frequency device according to claim 1, wherein the current sense function comprises a first transistor having a collector port operably coupled to receive the RF power amplifier DC current and a base port operably coupled to a base port of the RF PA.

10. A radio frequency device according to claim 9, wherein the current sense function further comprises a sensing resistor operably coupled to an emitter port of the first transistor to sense the RF power amplifier DC current.

11. A radio frequency device according to claim 10, wherein the current sense function further comprises a capacitor arranged in parallel to the sensing resistor.

12. A radio frequency device according to claim 9, wherein the current sense function further comprises a second transistor operably coupled to an emitter port of the first transistor and arranged to limit RF power amplifier DC current in response to the sensed current.

13. A method of limiting current supplied to a radio frequency (RF) power amplifier (PA) module operably coupled to a protection circuit, the method comprising:
sensing a power amplifier direct current (DC) applied to the RF PA in a protection circuit coupled between an input port and a collector port of the RF PA;
comparing, by the protection circuit, a threshold voltage value to a detected voltage associated with the sensed power amplifier DC current; and
limiting, by the protection circuit, direct current applied to the RF PA if the detected voltage exceeds the threshold voltage value.

14. A method of limiting current supplied to a RF PA module according to claim 13, wherein the step of limiting comprises de-biasing current supplied to a base port of the RF power amplifier.

15. A method of limiting current supplied to a RF PA module according to claim 13, wherein the step of sensing a direct current comprises sensing voltage supplied to the RF PA as a consequence of the protection circuit topography.

* * * * *